United States Patent
Rees et al.

(10) Patent No.: US 6,249,556 B1
(45) Date of Patent: Jun. 19, 2001

(54) DYNAMIC THRESHOLDING FOR INPUT RECEIVERS

(75) Inventors: Roger R. Rees, Beaverton; Harry L. Hampton, III, Aloha, both of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/085,394

(22) Filed: May 27, 1998

(51) Int. Cl.[7] .................................................. H04L 7/00
(52) U.S. Cl. .......................... 375/354; 375/317; 327/67; 327/87
(58) Field of Search ............................ 327/67, 73, 87; 375/317, 354

(56) References Cited

U.S. PATENT DOCUMENTS

| | | | |
|---|---|---|---|
| 3,908,115 | * 9/1975 | Waggener | 235/152 |
| 4,387,465 | * 6/1983 | Becker | 375/1 |
| 4,449,102 | * 5/1984 | Frazer | 328/162 |
| 4,475,210 | * 10/1984 | Couch | 375/10 |
| 4,585,952 | * 4/1986 | Yamamoto | 307/268 |
| 4,852,126 | * 7/1989 | Tanaka et al. | 375/76 |
| 5,097,486 | * 3/1992 | Newby et al. | 375/76 |
| 5,327,463 | * 7/1994 | Matsumoto | 375/76 |
| 5,764,703 | * 6/1998 | Charvin et al. | 375/317 |
| 5,805,641 | * 9/1998 | Patel | 375/317 |
| 5,900,749 | * 5/1999 | Hendrickson et al. | 327/96 |
| 6,094,461 | * 7/2000 | Heron | 375/317 |

* cited by examiner

Primary Examiner—Stephen Chin
Assistant Examiner—Tony Al-Beshrawi
(74) Attorney, Agent, or Firm—Blakely, Sokoloff, Taylor & Zafman LLP

(57) ABSTRACT

The present invention discloses a method and apparatus for thresholding an input signal synchronous with a clock signal at a receiver. The input signal is compared with a threshold voltage to produce a difference signal. The difference signal is synchronized with the input signal to generate a feedback signal. The threshold voltage is adjusted based on the feedback signal.

19 Claims, 5 Drawing Sheets

DYNAMIC THRESHOLDING FOR INPUT RECEIVERS

BACKGROUND OF THE INVENTION

1. Field of the Invention

This invention relates to circuit design. In particular, the invention relates to dynamic thresholding for input receivers.

2. Description of Related Art

As speed of microprocessors becomes faster to meet the demanding needs in the technology, the design of transmission and interconnection lines becomes more and more critical. Data integrity and reliable signal detection at the transmitting and receiving ends are important to ensure performance at high speeds.

When signal lines are combined together to form a signal bus, signal transmission and reception are sensitive to noise and crosstalk. The signals on these buses usually have fast edge rates, in the order of 2 Volts/nanosecond (V/nsec), or greater. Noise problems are caused by parasitic capacitance of the load and the unavoidable addition of stubs, normally the wire connections at a bus generated by the packaging design.

Stubs and parasitic capacitance are the two main sources that generate signal reflections that manifest themselves as undershoot and overshoot which lead to ringback. As clock speeds increase, these ringbacks may result in incorrect signal detection.

Signal detection in digital circuits usually uses a thresholding scheme. In this scheme, the signal to be detected is compared with a threshold voltage. This threshold voltage is usually a reference voltage, $V_{REF}$, which is fixed at a constant value. In positive logic detection, if the signal level is above $V_{REF}$, it is declared a logic one; otherwise, it is declared a logic zero.

The thresholding scheme works reasonably well for medium clock speeds. As clock speeds increase, the ringbacks caused by the overshoots and undershoots may result in incorrect thresholding, leading to erroneous signal detection.

There are a number of techniques in the prior art to deal with the problem. One technique imposes rigid rules in the routing of signal lines. The high speed signal lines are required to run at short distances to avoid stray capacitance and other crosstalk effects. The disadvantages of this technique include difficulties in signal routing, component placement, and board density allocation. Another technique is the use of hysterisis as in the Schmitt trigger. Although the Schmitt trigger technique provides some tolerance to the ringback portion of the signal, it causes extra delay in recognizing the signal transition.

Therefore there is a need in the technology to provide an efficient and reliable thresholding scheme for the input receivers that can operate at high speeds.

SUMMARY OF THE INVENTION

The present invention discloses a method and apparatus for thresholding an input signal synchronous with a clock signal at a receiver. Briefly, in one embodiment, the input signal is compared with a threshold voltage to produce a difference signal. The difference signal is synchronized with the input signal to generate a feedback signal. The threshold voltage is adjusted based on the feedback signal.

BRIEF DESCRIPTION OF THE DRAWINGS

The features and advantages of the present invention will become apparent from the following detailed description of the present invention in which.

DESCRIPTION OF THE PRESENT INVENTION

The present invention discloses a method and apparatus for thresholding signal at the input receivers. The thresholding scheme provides a positive feedback to the reference voltage that is used by the input receiver based on the previously clocked data bit. The invention provides a fast realized flight time by recognizing the signal transition earlier and increases the input receiver's noise margin to signal ringback.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention. An active LOW signal activates its function when it is low. An active HIGH signal activates its function when it is high. An active LOW signal is asserted when it is low, and deasserted when it is high. An active HIGH signal is asserted when it is high, and deasserted when it is low.

Figure 1:
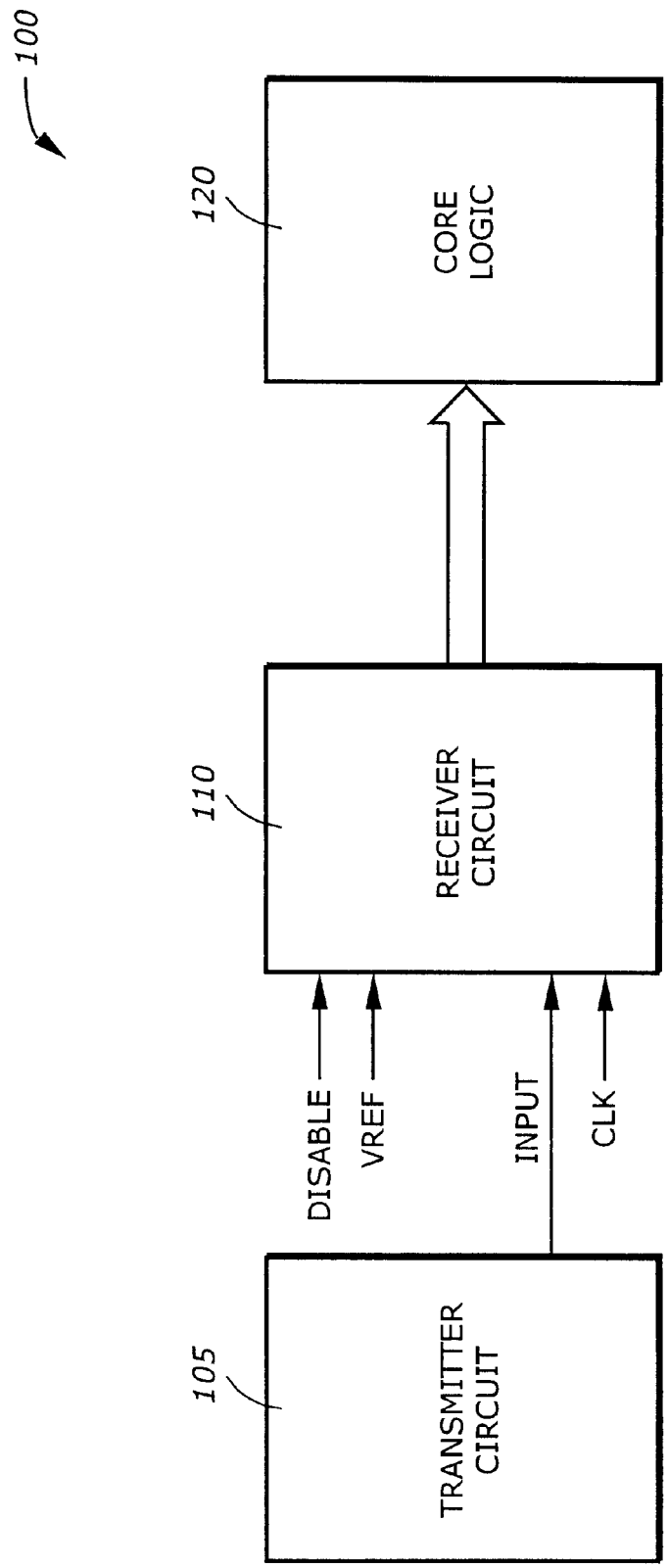
FIG. 1 is a diagram illustrating one embodiment of a system in accordance with the teachings of the invention.

FIG. 1 is a diagram illustrating one embodiment of a system in accordance with the teachings of the invention. The system 100 includes a transmitter circuit 105, a receiver circuit 110, and a core logic circuit 120.

The transmitter circuit 105 includes circuit components that generate signals to the receiver circuit 110. The signals may or may not be bussed. In the exemplary embodiment shown in FIG. 1, the signal INPUT is generated by the transmitter circuit 105 and received by the receiver circuit 110.

The receiver circuit 110 includes circuit components that receive the signal generated by the transmitter circuit 105 and detect the signal level. In the exemplary embodiment shown in FIG. 1, the receiver circuit 110 receives the INPUT signal generated by the transmitter circuit 105. The receiver circuit 110 also has as inputs a disable (DISABLE) control signal, a reference voltage (VREF), and a clock (CLK) signal. The DISABLE control signal is used to bypass the dynamic thresholding scheme and returns the receiver to operate in a static, or fixed, threholding scheme. The DISABLE signal controls the dynamic thresholding operation. When the DISABLE is asserted, the dynamic thresholding is disabled, leaving the receiver circuit in the static thresholding mode. When the DISABLE is de-asserted, or negated, the dynamic thresholding is enabled, varying the threshold voltage according to the previous input state. The VREF voltage provides the constant voltage level from which the threshold voltage is changed. The CLK signal is the system clock signal that is used to synchronize circuit elements.

The core logic circuit 120 is the circuit that receives the data as detected and thresholded by the receiver circuit 110.

In one embodiment, the core logic circuit 120 incorporates the receiver circuit 110 in its circuit components. In another embodiment, the core logic circuit 120 is a separate and independent circuit that processes the digital data as detected and thresholded by the receiver circuit 110.

Figure 2:
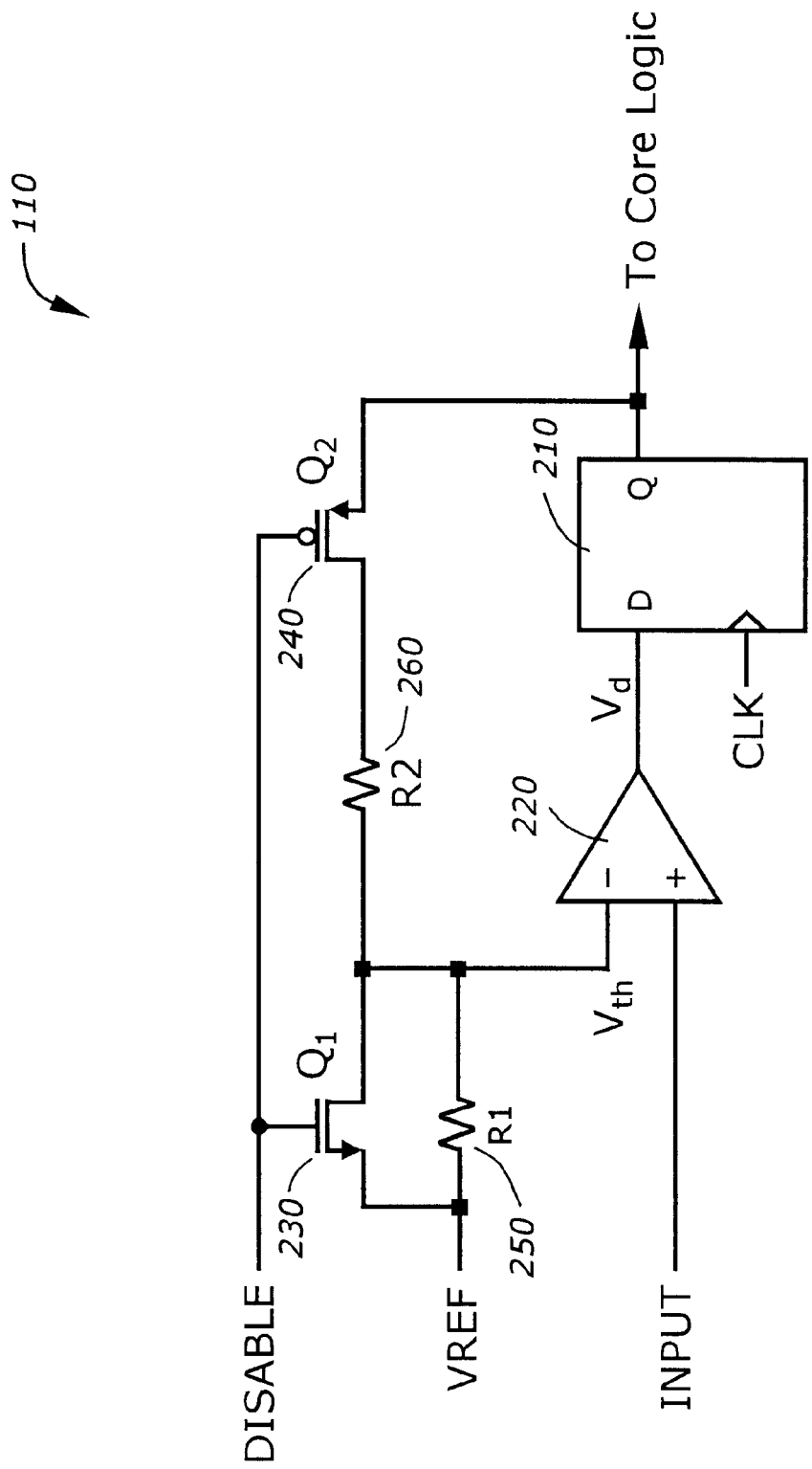
FIG. 2 is a diagram illustrating a receiver circuit with feedback according to one embodiment of the invention.

FIG. 2 is a diagram illustrating a receiver circuit with feedback according to one embodiment of the invention. The receiver circuit 110 includes a synchronizer 210, a comparator 220, an n-channel metal oxide semiconductor (NMOS) transistor 230 (Q1), a p-channel metal oxide semiconductor (PMOS) transistor 240 (Q2), resistors 250 (R1) and 260 (R2). The receiver circuit 110 receives the following input signals: CLK, INPUT, VREF, and DISABLE. In one embodiment, the synchronizer is a D flip-flop, and the comparator is an operational amplifier (OPAMP).

The synchronizer D flip-flop 210 synchronizes the input signal with the clock signal. The D flip-flop 210 receives the clock signal (CLK) to clock the data at the D input and transfer the data at the Q output. The D input to the D flip-flop 210 is the Vd signal which is the output of the OPAMP 220. The Vd signal represents the difference between the input signal and a threshold signal as will be explained later. The Q output of the D flip-flop 210 goes to the core logic circuit 120 (FIG. 1). In addition, the Q output of the D flip-flop 210 goes to the source/drain terminal of the PMOS transistor 240.

In this embodiment, comparator 220 is a differential operational amplifier (OPAMP) having negative and positive terminals. Of course, other circuitry may be used for comparison purposes. The OPAMP 220 receives the INPUT signal from the transmitter circuit 105 (FIG. 1) at the positive terminal and the dynamic threshold voltage Vth at the negative terminal. The INPUT signal is the signal that needs to be detected and thresholded. The threshold voltage Vth is dynamically changed by the operation of the two transistors 230 and 240 which will be explained later. The OPAMP 220 compares the INPUT signal with Vth and generates the difference signal Vd. Vd becomes the input to the D flip-flop 210.

The NMOS and PMOS transistors 230 and 240, respectively, operate as transmission gates or switches. They both receive the DISABLE control signal at the gates.

When the DISABLE signal is asserted HIGH, the NMOS transistor 230 is turned ON while the PMOS transistor 240 is turned OFF. The ON transistor 230 shorts out the resistor path across R1, effectively eliminating R1. Since R1 is effectively shorted, Vth is essentially at the VREF level. At the same time, the OFF transistor 240 opens the feedback path from the D flip-flop 210, essentially leaving the resistor path 260 unconnected. The entire circuit 110 in the DISABLE mode therefore reduces to a static thresholding circuit where the INPUT signal is compared with the fixed $V_{REF}$ signal.

When the DISABLE signal is de-asserted, or negated, LOW, the NMOS transistor 230 is turned OFF while the PMOS transistor 240 is turned ON. The ON transistor 240 connects the feedback path from the Q output of the D flip-flop to one end of the resistor R2 (260). At the same time, the OFF transistor 230 allows the VREF signal to go through the resistor R1 (250). The previously defined Vth voltage at node V essentially becomes a summing node that produces a voltage level that goes up or down based on the state of the D flip-flop 210. By selecting proper values of R1 and R2, the magnitude of the modulation at node V can be set at an appropriate level.

The threshold voltage Vth is therefore adjusted dynamically based on the previous state of the input signal. This helps increase the thresholding noise margin. In addition, by varying the threshold value, the receiver circuit is able to respond to the signal transition at a faster rate allowing early detection of the signal level.

Figure 3:
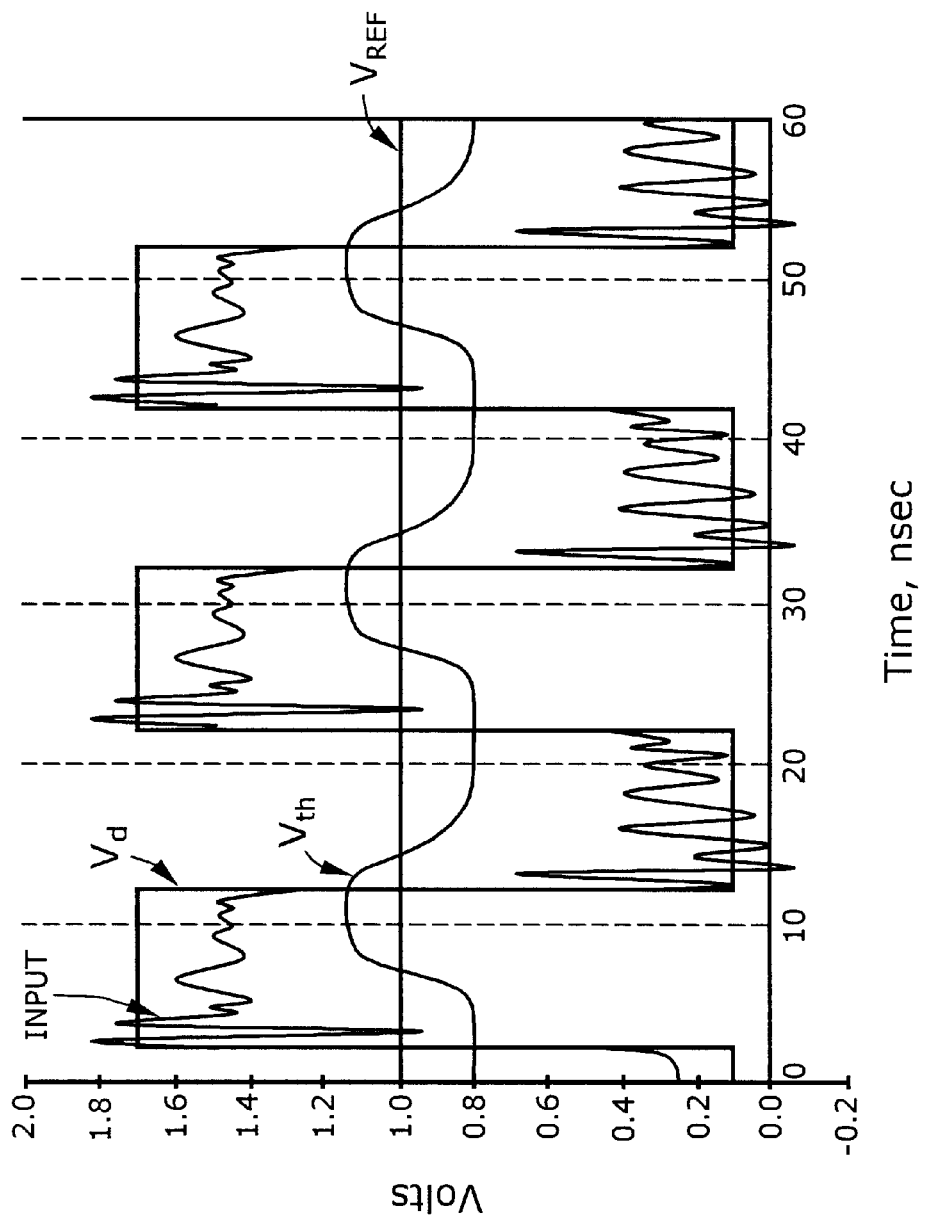
FIG. 3 is a timing diagram illustrating the waveforms for the receiver circuit with feedback shown in FIG. 2.

FIG. 3 is a timing diagram illustrating the waveforms for the receiver circuit with feedback shown in FIG. 2.

The $V_{REF}$ signal level is set at 1.0 Volt. The INPUT signal is a supposedly square waveform having a period of approximately 10 nsec. Due to signal ringback, the INPUT signal exhibits large overshoots and undershoots at the signal transitions near the 0 nsec, 10 nsec, 20 nsec. etc. marks.

Initially at t=0 nsec., Vd is HIGH and Vth is at the low threshold value of 0.8V. The undershoot at the INPUT signal does not reach this low threshold value, resulting in a reliable detection. The D flip-flop then clocks the Vd signal, resulting in the Vth signal changing from 0.8 V to almost 1.2 V at t=10 nsec. By raising the threshold value early (e.g., before the INPUT signal changes value), the INPUT signal can be reliably detected early. When the INPUT signal changes to low, the threshold voltage of the Vth signal has already been raised to 1.2V. Therefore, the overshoot at near 10 nsec of the INPUT signal does not reach the threshold value, resulting in reliable thresholding. The Vd signal is thresholded to be low. The process can be similarly explained at the next timing marks.

The receiver circuit 110 in FIG. 2 uses a feedback mechanism to adjust the current threshold voltage based on the previous detected input signal. When the INPUT signal changes state at a fast clock rate, it is desirable to synchronize the adjustment according to the input signal frequency. The output of the D flip-flop 210 clocked by the CLK signal conveniently provides this synchronous operation. Other techniques are possible for synchronous operation without using the CLK signal. One such technique is the use of a delay element.

Figure 4:
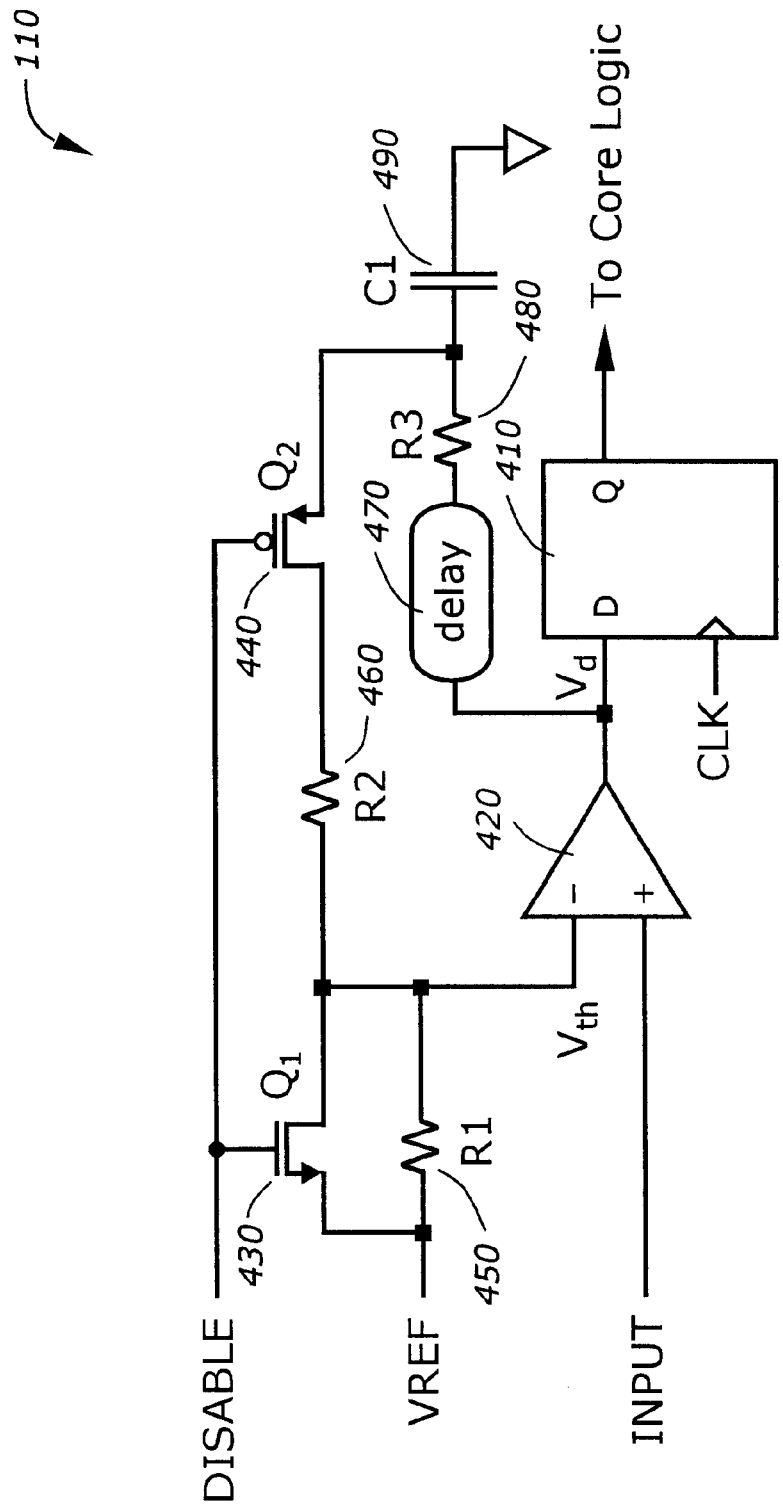
FIG. 4 is a diagram illustrating a receiver circuit using delay according to one embodiment of the invention.

FIG. 4 is a diagram illustrating a receiver circuit using delay according to another embodiment of the invention. The receiver circuit 110 includes a D flip flop 410, an operational amplifier (OPAMP) 420, an n-channel metal oxide semiconductor (NMOS) transistor 430 (Q1), a p-channel metal oxide semiconductor (PMOS) transistor 440 (Q2), resistors 450 (R1) and 460 (R2), a delay element 470, a filter resistor 480 (R3) and a capacitor 490 (C1). The receiver circuit 110 receives the following input signals: CLK, INPUT, VREF, and DISABLE.

The operation of the circuit in FIG. 4 is essentially the same as the circuit in FIG. 2. The main difference is that the circuit in FIG. 4 does not use the output of the D flip-flop in the feedback path to adjust the threshold voltage. Instead, the delay element 470 is used.

The delay element 470 introduces some timing delay in the feedback path. The value of the timing delay is calculated to match with the clock delay and the D flip-flop propagation delay. The delay element 470 can be implemented by a number of methods. One method is to use a string of buffers with small capacitive loads on each buffer. Another method is to use current sources, charging capacitors, and voltage comparators. Since the delay circuit is implemented in silicon, it may introduce variability of delay time over process, voltage, and temperature. However, the variability is within the acceptable operational range for reliable detection and thresholding.

The resistor 480 (R3) and capacitor 490 (C1) essentially act like a low pass filter and/or attenuator to reduce any overshoots/undershoots. The feedback path is formed by connecting one end of the resistor 480 to the source/drain terminal of the PMOS transistor 440 (Q2).

Figure 5:
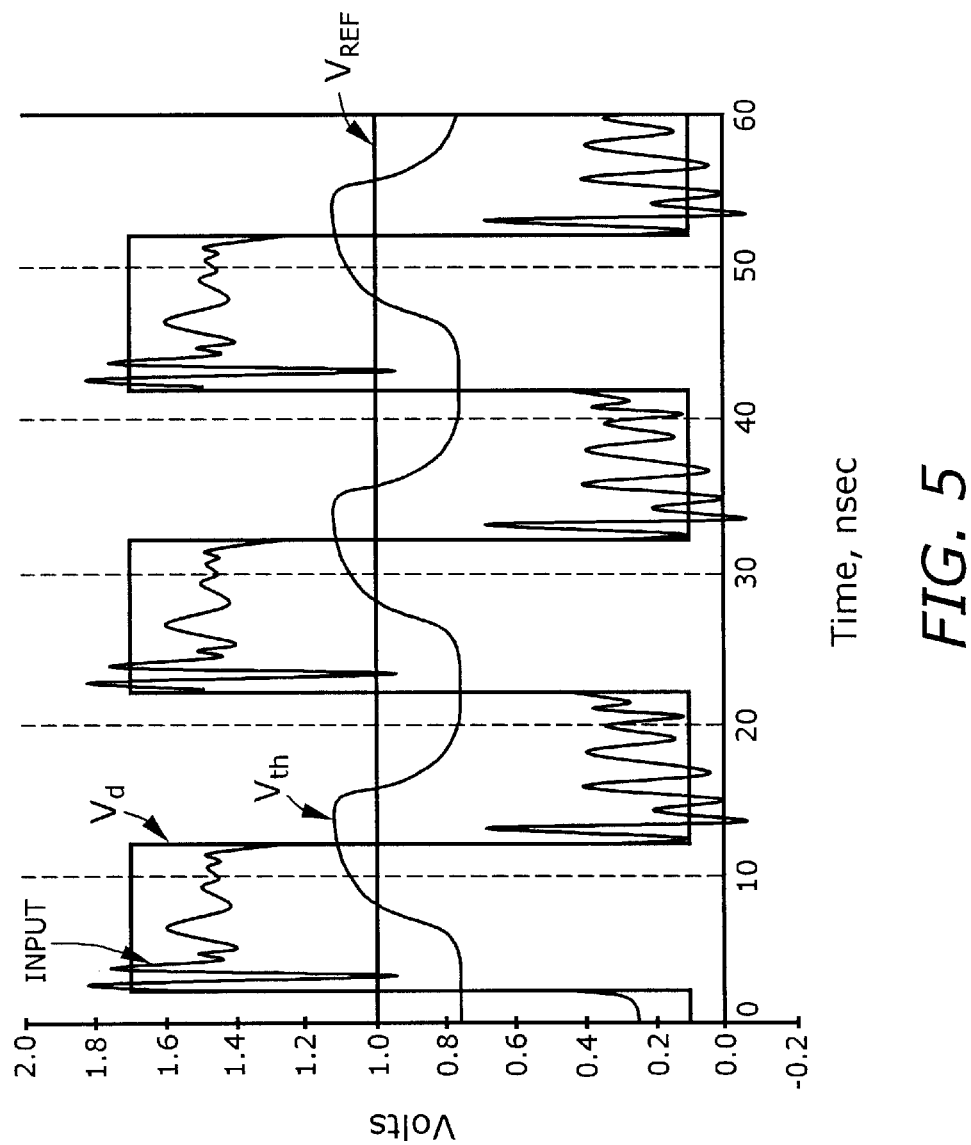
FIG. 5 is a timing diagram illustrating the waveforms for the receiver circuit using delay shown in FIG. 4.

FIG. 5 is a timing diagram illustrating the waveforms for the receiver circuit using delay shown in FIG. 4. The timing waveform in FIG. 5 is essentially the same as the timing waveform in FIG. 3 except that the waveform Vth exhibits some distortion.

The waveform Vth is produced by the feedback path formed by the delay element 470 and the low pass filter. The delay has been calculated to match with the delay of the clock and propagation delay of the flip-flop. Therefore, the position of the Vth in FIG. 5 is approximately the same as that of in FIG. 3. The difference is the shape of the waveform Vth. Although the shape of the Vth in FIG. 5 is not as sharp as that in FIG. 3, the threshold value is essentially the same. Furthermore, since overshoots/ undershoots occur mainly at the edge transitions, as long as the threshold voltage change covers the neighborhood of these transitions, the detection and comparison of the INPUT signal with the threshold voltage Vth should be reliable.

The present invention therefore discloses a method and apparatus for dynamically thresholding an input signal for reliable signal detection. The technique provides a fast detection and increases the noise margin.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
   comparing the input signal with a threshold voltage to produce a difference signal;
   synchronizing the difference signal with the input signal to generate a feedback signal; and
   adjusting the threshold voltage based on the feedback signal, the adjusting comprising:
   varying the threshold voltage based on a voltage divider, and
   connecting the feedback signal to the voltage divider via a switching circuit;
   wherein the switching circuit comprises a first transistor and a second transistor, the first and second transistors connecting the feedback signal to the voltage divider.

2. The method of claim 1 wherein synchronizing includes clocking the difference signal into a flip-flop.

3. The method of claim 2 wherein the feedback signal is an output of the flip-flop.

4. The method of claim 1 wherein synchronizing includes delaying the difference signal by a predetermined amount of time to generate a delayed signal.

5. The method of claim 4 wherein the delayed signal is filtered by a low-pass filter.

6. The method of claim 5 wherein the feedback signal is the filtered delayed signal.

7. The method of claim 1 wherein varying the threshold voltage includes decreasing a first amount and increasing a second amount around a reference voltage based on a previous state of the feedback signal.

8. An apparatus comprising:
   a comparator to compare an input signal with a threshold voltage to produce a difference signal;
   a synchronizer coupled to the comparator to synchronize the difference signal with the input signal to generate a feedback signal; and
   an adjusting circuit coupled to the comparator and the synchronizer to adjust the threshold voltage based on the feedback signal, the adjusting circuit comprising:
   a voltage divider to vary the threshold voltage, and
   a switching circuit to connect the feedback signal to the voltage divider;
   wherein the switching circuit comprises a first transistor and a second transistor, the first and second transistors connecting the feedback signal to the voltage divider.

9. The apparatus of claim 8 wherein the synchronizer comprises a flip-flop, the flip-flop clocking the difference signal by the clock signal.

10. The apparatus of claim 9 wherein the feedback signal is an output of the flip-flop.

11. The apparatus of claim 8 wherein the synchronizer comprises a delay element to delay the difference signal by a predetermined amount of time to generate a delayed signal.

12. The apparatus of claim 11 wherein the delayed signal is filtered by a low-pass filter.

13. The apparatus of claim 12 wherein the feedback signal is the filtered delayed signal.

14. The apparatus of claim 8 wherein the voltage divider decreases the threshold voltage by a first amount and increases the threshold voltage by a second amount based on a previous state of the feedback signal.

15. A system comprising:
   a transmitter circuit which transmits an input signal synchronously with a clock signal; and
   a receiver circuit coupled to the transmitter circuit for receiving the input signal, the receiver circuit including:
   a comparison circuit to compare the input signal with a threshold voltage to produce a difference signal,
   a synchronizer coupled to the comparison circuit to synchronize the difference signal with the input signal to generate a feedback signal, and
   an adjusting circuit coupled to comparison circuit and the synchronizer to adjust the threshold voltage based on the feedback signal, the adjusting circuit comprising:
   a voltage divider to vary the threshold voltage, and
   a switching circuit to connect the feedback signal to the voltage divider,
   wherein the switching circuit comprises a first transistor and a second transistor, the first and second transistors connecting the feedback signal to the voltage divider.

16. The system of claim 15 wherein the synchronizer is a flip-flop, the flip-flop clocking the difference signal by the clock signal.

17. The system of claim 15 wherein the synchronizer comprises a delay element to delay the difference signal by a predetermined amount of time to generate a delayed signal.

18. The system of claim 17 wherein the synchronizer further comprises a filter for filtering the delayed signal to produce the feedback signal.

19. The system of claim 15 wherein the voltage divider decreases the threshold voltage by a first amount and increases the threshold voltage by a second amount based on a previous state of the feedback signal.

\* \* \* \* \*